United States Patent
Horng et al.

(10) Patent No.: US 8,821,227 B2
(45) Date of Patent: Sep. 2, 2014

(54) HEAT DISSIPATING SYSTEM

(75) Inventors: Alex Horng, Kaohsiung (TW); Ming-Tsung Li, Kaohsiung (TW); Chao-Hsun Lee, Kaohsiung (TW)

(73) Assignee: Sunonwealth Electric Machine Industry Co., Ltd., Kaohsiung (TW)

(*) Notice: Subject to any disclaimer, the term of this patent is extended or adjusted under 35 U.S.C. 154(b) by 1298 days.

(21) Appl. No.: 12/574,729

(22) Filed: Oct. 7, 2009

(65) Prior Publication Data

US 2011/0079374 A1 Apr. 7, 2011

(51) Int. Cl.
*H05K 7/20* (2006.01)
*H05K 5/00* (2006.01)
*G06F 1/20* (2006.01)

(52) U.S. Cl.
CPC ............. *G06F 1/20* (2013.01); *H05K 7/20172* (2013.01)
USPC .......................................... 454/184; 361/695

(58) Field of Classification Search
USPC .......................................... 454/184; 361/695
See application file for complete search history.

(56) References Cited

U.S. PATENT DOCUMENTS

| | | | |
|---|---|---|---|
| 5,954,124 A * | 9/1999 | Moribe et al. | 165/104.34 |
| 5,973,921 A | 10/1999 | Lin | |
| 6,266,243 B1 * | 7/2001 | Tomioka | 361/695 |
| 6,290,471 B1 | 9/2001 | Horng | |
| 6,487,076 B1 | 11/2002 | Wang | |
| 6,537,019 B1 * | 3/2003 | Dent | 415/61 |
| 6,637,637 B2 * | 10/2003 | Yamasaki et al. | 228/9 |
| 6,664,673 B2 * | 12/2003 | Lopatinsky et al. | 310/63 |
| 7,123,484 B2 * | 10/2006 | Tsai | 361/719 |
| 7,173,353 B2 * | 2/2007 | Lopatinsky et al. | 310/58 |
| 7,215,543 B2 * | 5/2007 | Arbogast et al. | 361/695 |
| 7,238,004 B2 * | 7/2007 | Lin et al. | 415/199.4 |
| 7,248,471 B2 * | 7/2007 | Wabiszczewicz | 361/694 |
| 7,309,131 B2 * | 12/2007 | Asada | 353/61 |
| 7,656,659 B2 * | 2/2010 | Cheng et al. | 361/679.48 |
| 7,740,446 B2 * | 6/2010 | Lin et al. | 415/199.4 |
| 8,007,232 B2 * | 8/2011 | Hwang et al. | 415/206 |
| 8,087,909 B2 * | 1/2012 | Shener | 417/477.3 |
| 8,152,495 B2 * | 4/2012 | Boggess et al. | 417/423.14 |
| 2005/0287003 A1 | 12/2005 | Horng et al. | |
| 2008/0180910 A1 * | 7/2008 | Tomioka | 361/695 |
| 2009/0215380 A1 * | 8/2009 | Lin | 454/184 |

* cited by examiner

*Primary Examiner* — Steven B McAllister
*Assistant Examiner* — Frances H Kamps
(74) *Attorney, Agent, or Firm* — Alan Kamrath; Kamrath IP Lawfirm, P.A.

(57) ABSTRACT

A heat dissipating system includes a housing having a compartment divided into first and second air channels by a partitioning board. The partitioning board includes an opening through which the first air channel is in communication with the second air channel. A driving unit is mounted in the first air channel. The driving unit includes a rotating shaft extending through the opening into the second air channel. A first impeller is mounted in the first air channel, coupled to the rotating shaft, and aligned with the opening. A second impeller is mounted in the second air channel, coupled to the rotating shaft, and aligned with the opening. The first and second impellers mounted in the first and second air channels are driven by the driving unit to simultaneously dissipate heat generated by electronic elements in the first and second air channels while having a simplified structure.

11 Claims, 6 Drawing Sheets

HEAT DISSIPATING SYSTEM

BACKGROUND OF THE INVENTION

1. Field of the Invention

The present invention relates to a heat dissipating system and, more particularly, to a heat dissipating system capable of proceeding with heat dissipation for electronic elements in adjacent spaces.

2. Description of the Related Art

The operational temperature of the interior systems of electronic products rises more rapidly as the functions and speed of the electronic products upgrade. Heat dissipating devices are widely utilized to maintain normal operational temperature for the electronic elements such as the microprocessors or chips of the interior systems.

A common approach for lowering the temperature of the electronic elements in the electronic products is driving air currents by heat dissipating fans through the electronic elements. Generally, a heat dissipating fan is fixed related to an electronic element and preferably uses a heat sink made of highly conductive metal material mounted to a side of the electronic element for lowering the temperature of the electronic element. However, a large number of the heat dissipating fans would be required in the electronic product if many electronic elements are involved, resulting in large wind noise, consuming considerable energy, and increasing the costs as well as causing difficulties in miniaturization of the electronic product.

U.S. Pat. No. 6,487,076 discloses a compact heat sink module for use with a central processing unit. The compact heat sink module includes a body separately connected on a base for connection to the central processing unit to carry heat away from the central processing unit. The body includes at least one assembling device connected on a surface of the base. A conducting block is connected to the at least one assembling device for connecting to the central processing unit. At least one conductor is connected to the at least one assembling device for dispersing heat from the conducting block. A plurality of gaps is defined in the at least one conductor. A fan is mounted to the base and retained within the at least one assembling device and the conducting block. The fan has a heat exchange function with the at least one conductor and the conducting block. Thus, heat generated by the central processing unit is effectively dispersed by the heat sink module. However, the fan can supply air only in the radial direction, such that the conducting block and the at least one conductor must surround the fan. Furthermore, the fan can not directly proceed with heat dissipation for electronic elements in different spaces. The common problems including large wind noise, consumption of considerable energy, increased costs, and difficulties in miniaturization of the product still exist.

SUMMARY OF THE INVENTION

An objective of the present invention is to provide a heat dissipating system capable of proceeding with heat dissipation for electronic elements in adjacent spaces.

Another objective of the present invention is to provide a heat dissipating system utilizing a single driving unit to drive a plurality of impellers to proceed with heat dissipation in different spaces, simplifying the structure and reducing the costs.

A further objective of the present invention is to provide a heat dissipating system utilizing a single driving unit to drive a plurality of impellers to proceed with heat dissipation in different spaces, lowering noise and reducing energy consumption.

The present invention fulfills the above objectives by providing, in a preferred form, a heat dissipating system including a housing having a compartment. A partitioning board is mounted in the compartment and divides the compartment into first and second air channels. The partitioning board includes an opening through which the first air channel is in communication with the second air channel. A driving unit is mounted in the first air channel. The driving unit includes a rotating shaft extending through the opening into the second air channel. A first impeller is mounted in the first air channel, coupled to the rotating shaft, and aligned with the opening. A second impeller is mounted in the second air channel, coupled to the rotating shaft, and aligned with the opening. The first and second impellers mounted in the first and second air channels adjacent to each other are driven by the driving unit to simultaneously dissipate heat generated by electronic elements in the first and second air channels while having a simplified structure.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

Figure 1:
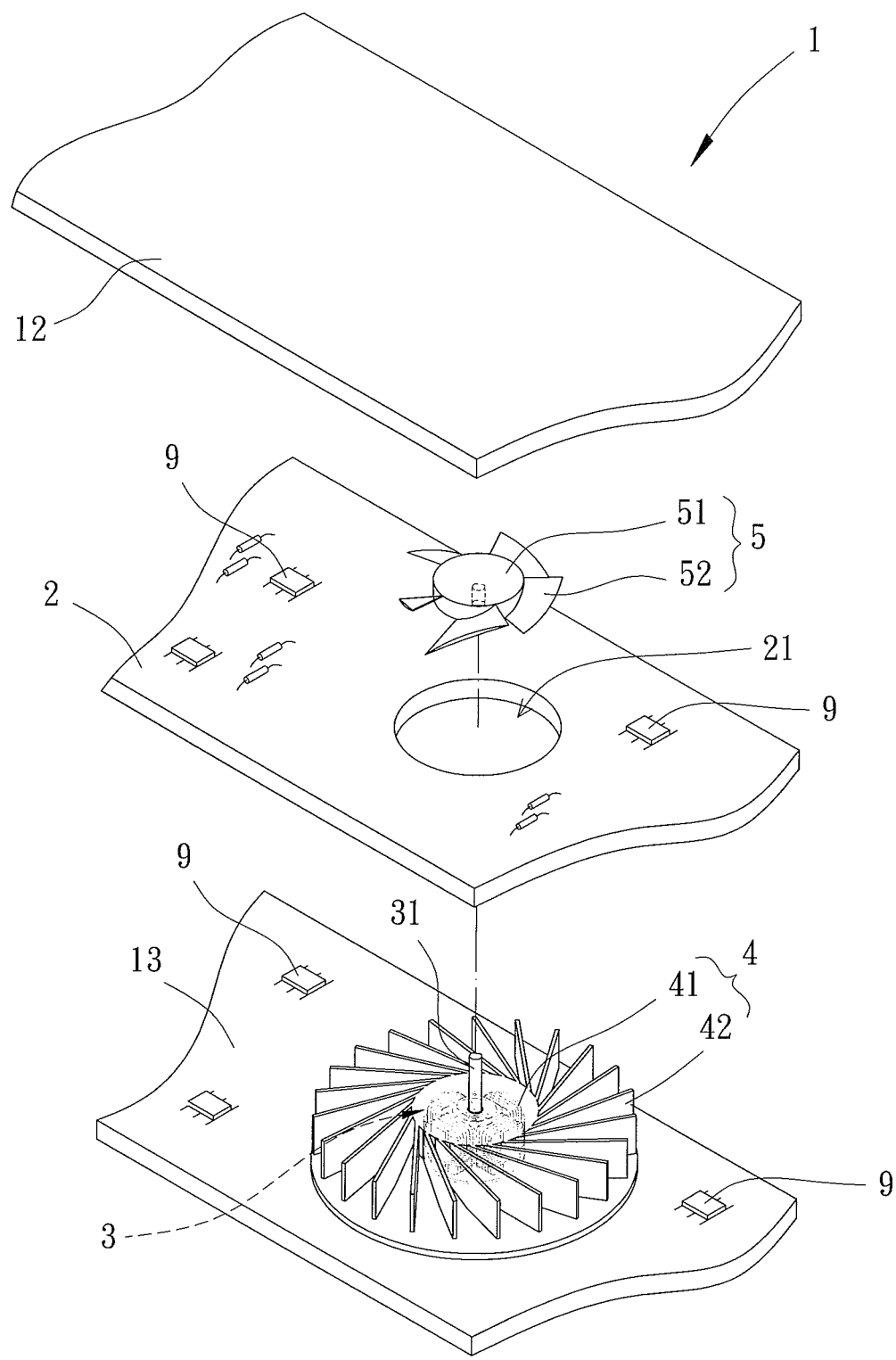
FIG. 1 shows a partial, exploded, perspective view of a heat dissipating system of a first embodiment according to the preferred teachings of the present invention.

All figures are drawn for ease of explanation of the basic teachings of the present invention only; the extensions of the figures with respect to number, position, relationship, and dimensions of the parts to form the preferred embodiments will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

Where used in the various figures of the drawings, the same numerals designate the same or similar parts. Furthermore, when the terms "first", "second", "outer", "end", "axial", "radial", and similar terms are used herein, it should be understood that these terms have reference only to the structure shown in the drawings as it would appear to a person viewing the drawings and are utilized only to facilitate describing the invention.

DETAILED DESCRIPTION OF THE INVENTION

Figure 2:
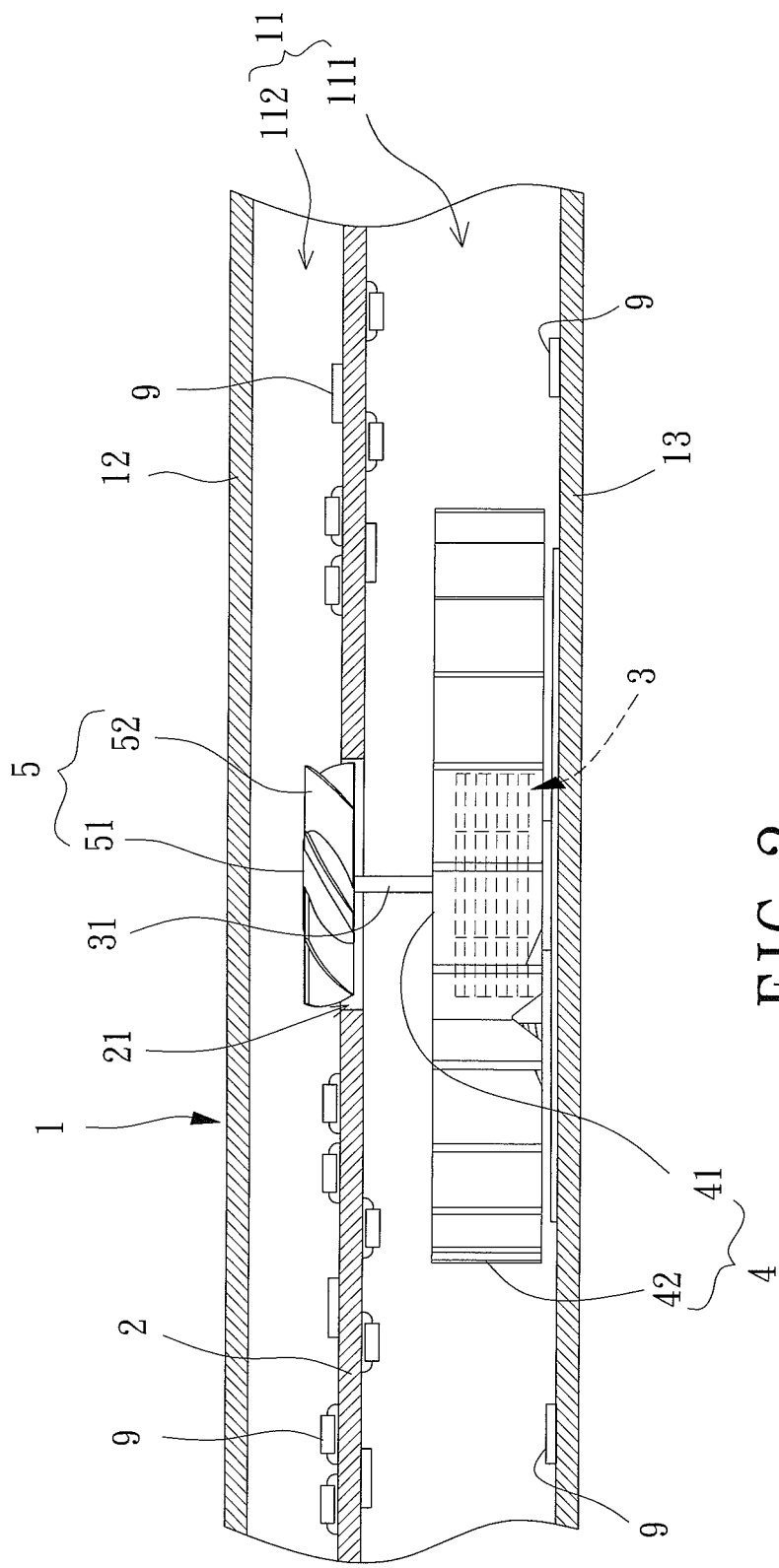
FIG. 2 shows a partial, cross sectional view of the heat dissipating system of FIG. 1.

With reference to FIGS. 1 and 2, a heat dissipating system of a first embodiment according to the preferred teachings of the present invention is adapted to proceed with heat dissipation for a plurality of electronic elements 9 such as microprocessors, chips, and/or passive elements. The heat dissipating system includes a housing 1, a partitioning board 2, a driving unit 3, a first impeller 4, and a second impeller 5. The housing 1 includes a compartment 11 receiving the electronic elements 9. Also, the partitioning board 2, the driving unit 3, and the first and second impellers 4 and 5 are received in the compartment 11. The first and second impellers 4 and 5 are mounted to the driving unit 3 and can be driven by the driving unit 3 to proceed with heat dissipation for the electronic elements 9.

With reference to FIG. 2, the compartment 11 is defined between first and second boards 12 and 13 of the housing 1. Furthermore, the compartment 11 is divided by the partitioning board 2 into first and second air channels 111 and 112. The first air channel 111 is located between the second board 13 and the partitioning board 2. The second air channel 112 is located between the first board 12 and the partitioning board 2.

The partitioning board 2 can be a printed circuit board or a plastic insulating board. In the first embodiment, the partitioning board 2 is a printed circuit board on which the electronic elements 9 are mounted. Specifically, the electronic elements 9 are located in the first and second air channels 111 and 112. The partitioning board 2 includes an opening 21 through which the first air channel 111 is in communication with the second air channel 112.

The driving unit 3 is mounted in the first air channel 111 and preferably in the form of a motor having an axle seat, a stator, etc. The motor can be of any desired form as conventional including but not limited to of a commercially available type. The driving unit 3 includes a rotating shaft 31 extending from the first air channel 111 into the second air channel 112 via the opening 21.

The first impeller 4 is received in the first air channel 111 and coupled to the rotating shaft 31. The second impeller 5 is received in the second air channel 112 and coupled to the rotating shaft 31. The first and second impellers 4 and 5 can be of an axial-flow type or a blower type. In the first embodiment, the first impeller 4 is of blower type, and the second impeller 5 is of axial-flow type. Each of the first and second impellers 4 and 5 includes a hub 41, 51 and a plurality of blades 42, 52 mounted to an outer periphery of the hub 41, 51. Furthermore, each of the first and second impellers 4 and 5 has a central axis aligned with a center of the opening 21. The opening 21 has a diameter larger than an outer diameter of the hub 41 of the first impeller 4 and not smaller than a maximum diameter of the second impeller 5.

Figure 3:
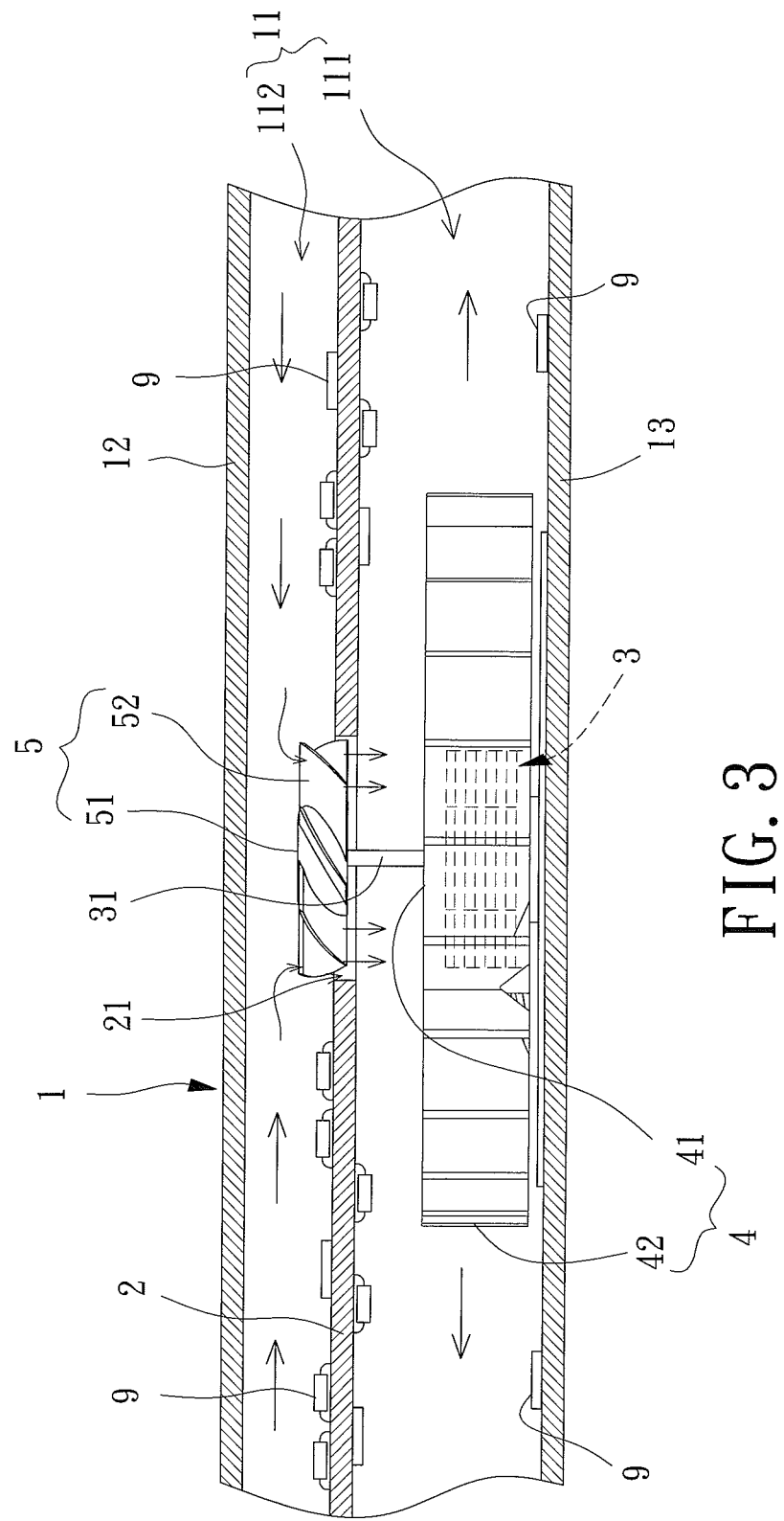
FIG. 3 shows a partial, cross sectional view of the heat dissipating system of FIG. 1, illustrating flow of air currents during operation of the heat dissipating system.

With reference to FIG. 3, in operation of the heat dissipating system of the first embodiment according to the teachings of the present invention, the first and second impellers 4 and 5 are simultaneously driven by the rotating shaft 31 of the driving unit 3. Since the second impeller 5 is of an axial-flow type, air is continuously driven by the second impeller 5 from the second air channel 112 into the first air channel 111 via the opening 21. Since the first impeller 4 is of a blower type, the air continuously driven through the opening 21 by the second impeller 5 can be driven into the first air channel 111 in a radial direction by the first impeller 4. Thus, air currents continuously flow from the second air channel 112 into the first air channel 111 to increase the heat exchange efficiency of the electronic elements 9 in the first and second air channels 111 and 112. As a result, the heat generated by the electronic elements 9 can be dissipated to maintain a proper operational temperature for the electronic elements 9.

The heat dissipating system according to the teachings of the present invention can proceed with heat dissipation in two adjacent spaces (first and second air channels 111 and 112) by simultaneously rotating two impellers 4 and 5 respectively in the spaces with a single driving unit 3, so that the air in the spaces can flow to increase the heat dissipation efficiency of the electronic elements 9 in the spaces. Thus, due to use of a single driving unit 3 in the heat dissipating system according to the present invention to dissipate heat generated by the electronic elements 9 in the spaces, the operational noise, the energy consumed, and the manufacturing costs are lowered, and miniaturization of the product is possible.

Furthermore, since the diameter of the opening 21 is not smaller than the maximum diameter of the second impeller 5, the air currents outputted by the second impeller 5 of an axial-flow type can flow smoothly through the opening 21. Furthermore, since the diameter of the opening 21 is larger than the diameter of the hub 41 of the first impeller 4, the air currents axially flowing through the opening 21 can be smoothly drawn into the first air channel 111 by the first impeller 4 of a blower type. Thus, the air currents can flow more smoothly to further increase the heat dissipating efficiency while maintaining the temperature in the first air channel 111 to be almost the same as that in the second air channel 112, avoiding large temperature differences in the first and second air channels 111 and 112.

Figure 4:
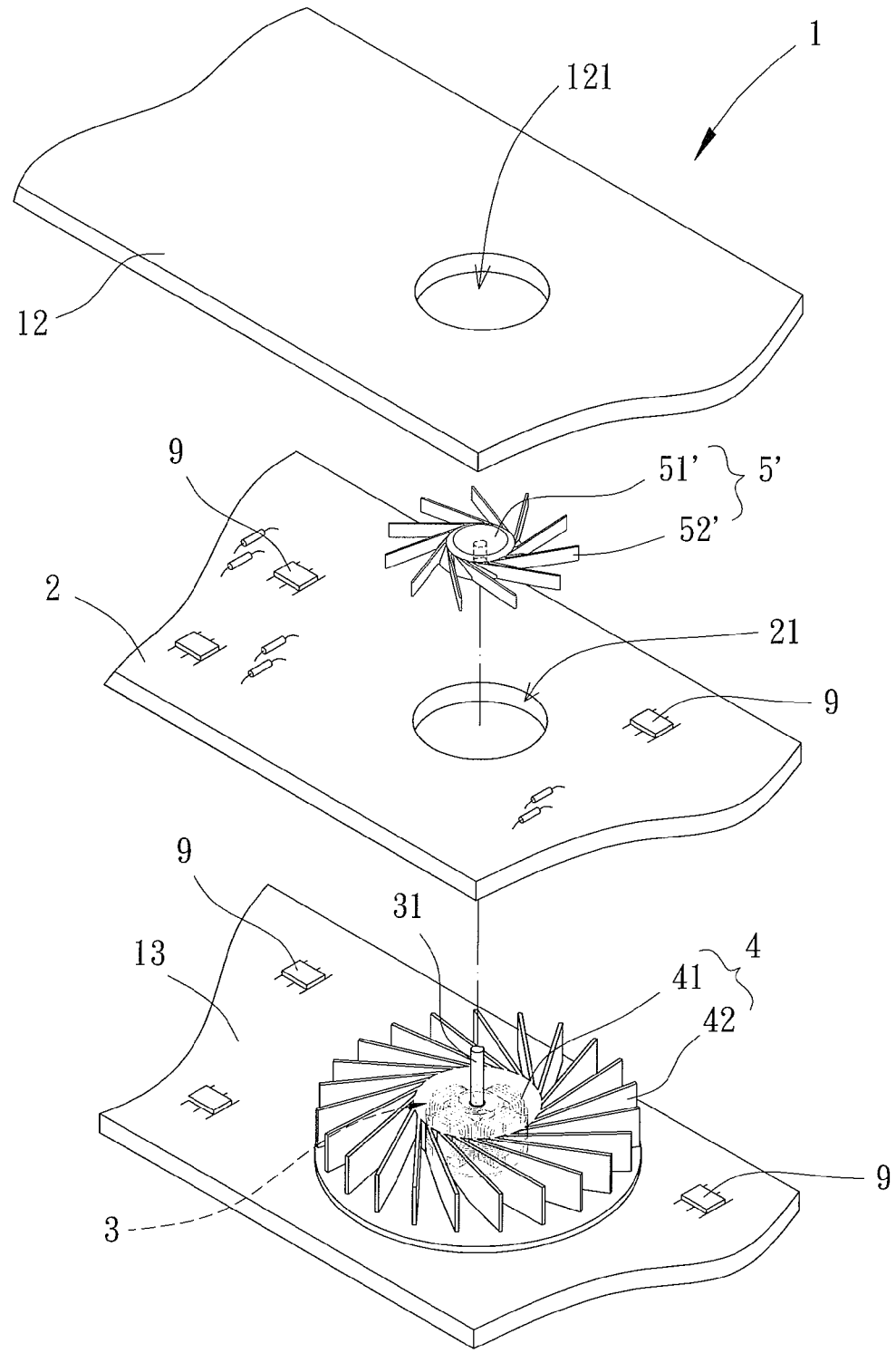
FIG. 4 shows a partial, exploded, perspective view of a heat dissipating system of a second embodiment according to the preferred teachings of the present invention.
Figure 5:
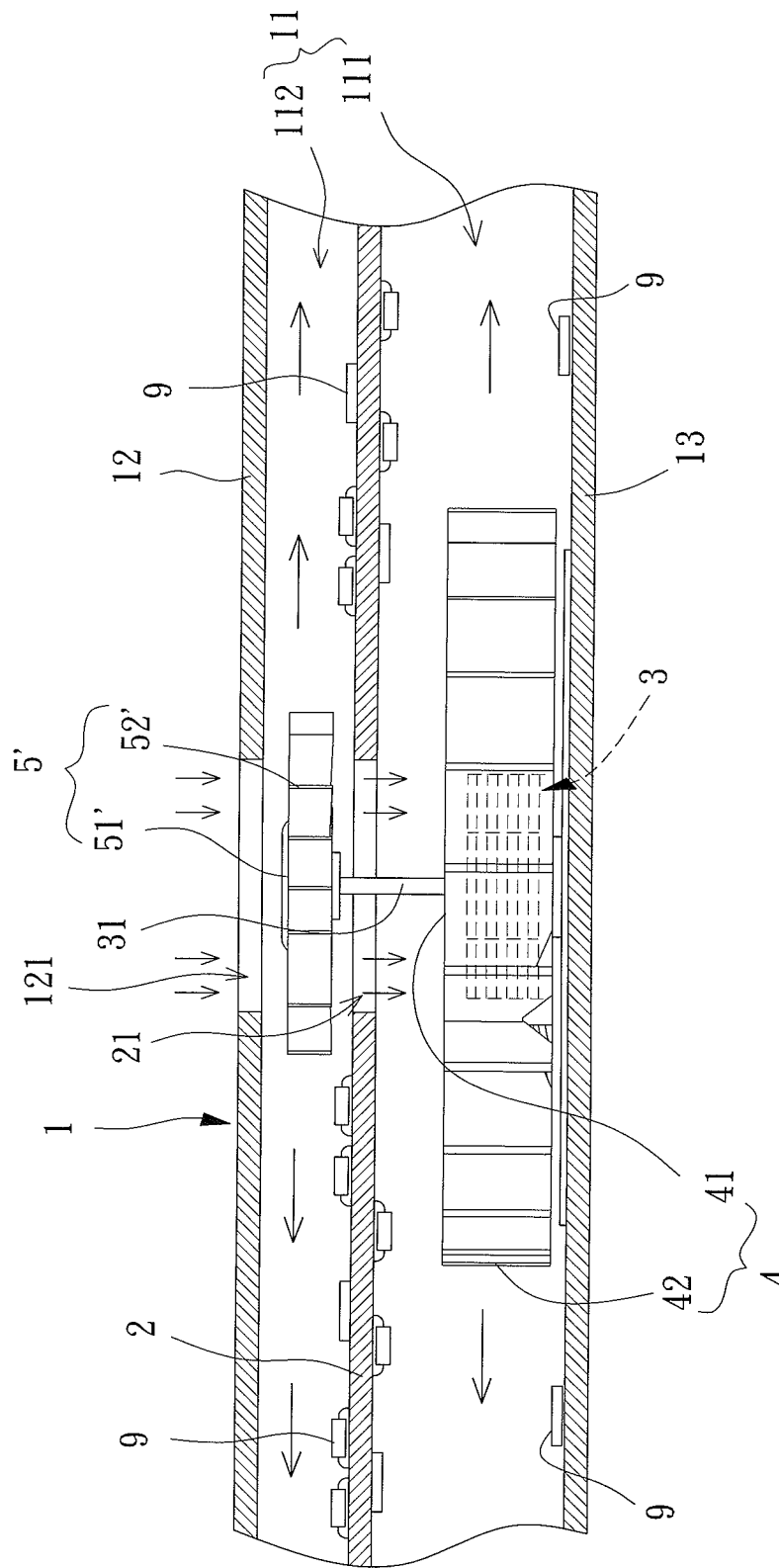
FIG. 5 shows a partial, cross sectional view of the heat dissipating system of FIG. 4, illustrating flow of air currents during operation of the heat dissipating system.

FIGS. 4 and 5 show a heat dissipating system of a second embodiment according to the preferred teachings of the present invention. Compared to the first embodiment, the second impeller 5' of the second embodiment is of a blower type and mounted to an end of the rotating shaft 31. The second impeller 5' includes a hub 51' and a plurality of blades 52'. Furthermore, the first board 12 of the housing 1 includes an air inlet 121 aligned with the center of the opening 21 and the central axis of the second impeller 5'. Further, the air inlet 121 is in communication with the second air channel 112. The diameters of both of the air inlet 121 and the opening 21 are larger than an outer diameter of the hub 51'.

In operation of the second embodiment, the first and second impellers 4 and 5' are simultaneously driven by the driving unit 3. Since the second impeller 5' is of a blower type, the ambient air is drawn in via the air inlet 121 by the second impeller 5'. A portion of the air drawn in by the second impeller 5' turns into radial air currents flowing into the second air channel 112. Since the blow-type first impeller 4 is larger than the second impeller 5', another portion of the air drawn in by the second impeller 5' is driven into the first air channel 111 in the radial direction by the first impeller 4. By such an arrangement, the ambient air can be drawn into the first and second air channels 111 and 112 to proceed with heat exchange for dissipating heat generated by the electronic elements 9 in the first and second air channels 111 and 112, increasing the heat dissipating efficiency.

Figure 6:
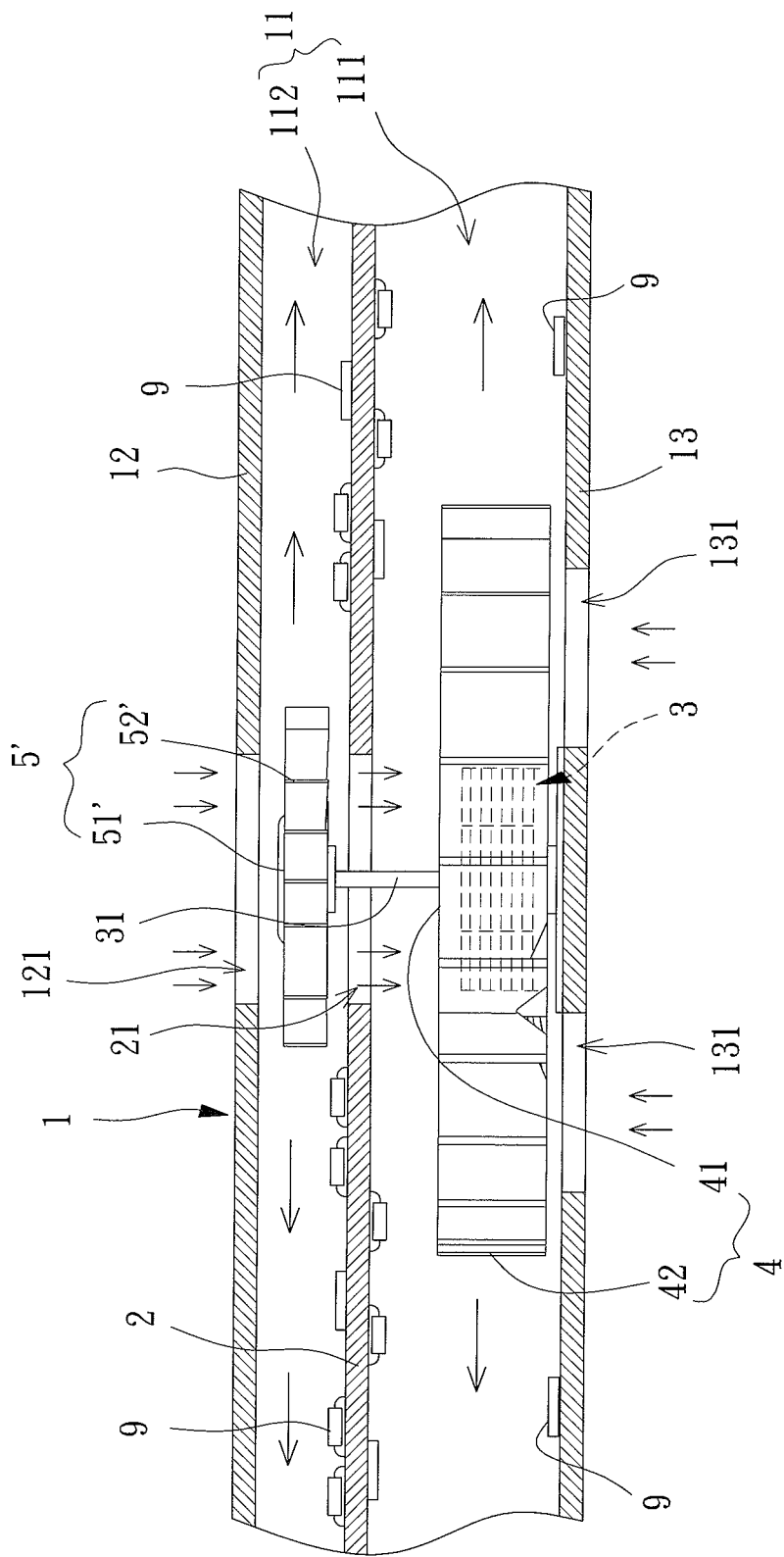
FIG. 6 shows a partial, cross sectional view of a heat dissipating system of a third embodiment according to the preferred teachings of the present invention, illustrating flow of air currents during operation of the heat dissipating system.

FIG. 6 shows a heat dissipating system of a third embodiment according to the preferred teachings of the present invention. Compared to the second embodiment, the second board 13 also has an air inlet 131 aligned with the blades 42 of the first impeller 4 and in communication with the first air channel 111. In operation of the third embodiment, the first and second impellers 4 and 5' are simultaneously driven by the driving unit 3. In addition to drawing air through the opening 21, the first impeller 4 can also draw in ambient air via the air inlet 131 to further increase the amount of air inputted, further increasing the overall heat dissipating efficient.

Although the first impeller 4 shown in the third embodiment is larger than the second impeller 5', the first and second impellers 4 and 5' can be of the same size. The sizes of the first and second impellers 4 and 5, 5' are not limited to those shown in the drawings.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A heat dissipating system comprising:
 a housing including first and second boards between which a compartment is defined, with a partitioning board mounted in the compartment and dividing the compartment into first and second air channels, with the partitioning board including an opening through which the first air channel is in communication with the second air channel, with the partitioning board being a printed circuit board and including a plurality of electronic elements located in the first and second air channels;
 a driving unit mounted in the first air channel, with the driving unit including a rotating shaft extending through the opening into the second air channel;
 a first impeller mounted in the first air channel and coupled to the rotating shaft and aligned with the opening; and
 a second impeller mounted in the second air channel and coupled to the rotating shaft and aligned with the opening, with some of the plurality of electronic elements located within a maximum outer diameter of the first impeller.

2. The heat dissipating system as claimed in claim 1, with each of the first and second impellers including a hub and a plurality of blades mounted on an outer periphery of the hub.

3. The heat dissipating system as claimed in claim 2, with the opening having a diameter larger than an outer diameter of the hub of the first impeller.

4. The heat dissipating system as claimed in claim 3, with the diameter of the opening larger than an outer diameter of the hub of the second impeller.

5. The heat dissipating system as claimed in claim 2, with the first board including a first air inlet in communication with the second air channel and aligned with the opening and the first and second impellers.

6. The heat dissipating system as claimed in claim 5, with a diameter of the first air inlet larger than an outer diameter of the hub of the second impeller.

7. The heat dissipating system as claimed in claim 5, with the second board including a second air inlet in communication with the first air channel and within a maximum diameter of the first impeller.

8. The heat dissipating system as claimed in claim 5, with the first and second impellers being of a blower type.

9. The heat dissipating system as claimed in claim 1, with the second impeller extending into the opening and being of an axial-flow type.

10. The heat dissipating system as claimed in claim 9, with the first impeller being of a blower type, with a maximum outer diameter of the first impeller being larger than the opening and a maximum outer diameter of the second impeller.

11. The heat dissipating system as claimed in claim 1, with the diameter of the opening not smaller than a maximum outer diameter of the second impeller.

* * * * *